(12) United States Patent  
Fellner

(10) Patent No.: US 8,188,775 B2  
(45) Date of Patent: May 29, 2012

(54) CIRCUIT ARRANGEMENT FOR OPERATING VOLTAGE DETECTION

(75) Inventor: Johannes Fellner, Pirka (AT)

(73) Assignee: austriamicrosystems AG, Unterpremstätten (AU)

( * ) Notice: Subject to any disclaimer, the term of this patent is extended or adjusted under 35 U.S.C. 154(b) by 248 days.

(21) Appl. No.: 12/750,040

(22) Filed: Mar. 30, 2010

(65) Prior Publication Data

US 2010/0253399 A1 Oct. 7, 2010

(30) Foreign Application Priority Data

Apr. 1, 2009 (DE) .......................... 10 2009 015 840

(51) Int. Cl.
*H03L 7/00* (2006.01)
(52) U.S. Cl. ............... 327/143; 327/77; 327/80; 327/81
(58) Field of Classification Search .................... 327/77, 327/78, 80, 81, 142, 143
See application file for complete search history.

(56) References Cited

U.S. PATENT DOCUMENTS

| 5,323,067 | A | | 6/1994 | Shay | |
| 5,929,673 | A | * | 7/1999 | Haigis et al. | 327/143 |
| 6,137,324 | A | | 10/2000 | Chung | |
| 6,710,634 | B2 | | 3/2004 | Ohbayashi et al. | |
| 7,023,244 | B2 | * | 4/2006 | Lee et al. | 327/143 |
| 7,696,795 | B2 | * | 4/2010 | Choi | 327/143 |
| 7,825,705 | B2 | * | 11/2010 | Kawakita | 327/143 |

FOREIGN PATENT DOCUMENTS

JP 2004-200919 7/2004

* cited by examiner

Primary Examiner — Long Nguyen
(74) Attorney, Agent, or Firm — Cozen O'Connor

(57) ABSTRACT

A circuit arrangement for operating voltage detection has a detection block (1) and a control block (2). Detection block (1) has a first transistor (P1) that is connected between a first supply voltage terminal (VDD) and a first node (K1) and has a first control terminal (S1), a first resistor element (R1) that is connected between first node (K1) and second supply voltage terminal (VSS), a second transistor (P2) that is connected between first supply voltage terminal (VDD) and a second node (K2) and has a second control terminal (S2), a second resistor element (R2) that is connected between second node (K2) and second supply voltage terminal (VSS), a first switch (N1) that connects first node (K1) to second control terminal (S2), and a third resistor element (R3) that is connected between second control terminal (S2) and first supply voltage terminal (VDD). Control block (K2) is set up to derive a first switching signal as a function of a voltage at second node (K2), as well as a second switching signal by inverting the first switching signal. The first switching signal is supplied to first switch (N1), and the second switching signal to first control terminal (S1).

12 Claims, 2 Drawing Sheets

CIRCUIT ARRANGEMENT FOR OPERATING VOLTAGE DETECTION

RELATED APPLICATIONS

This application claims the priority of German application no. 0 2009 015 840.5 filed Apr. 1, 2009, the entire content of which is hereby incorporated by reference.

FIELD OF THE INVENTION

The invention relates to a circuit arrangement for operating voltage detection that supplies, as a function of an applied supply voltage, a defined level for setting and resetting digital circuit elements.

BACKGROUND OF THE INVENTION

Many semiconductor circuits with digital gates require a defined level for setting or resetting the digital gates when the supply voltage is turned on, in order to be able to bring the semiconductor circuits to a defined state. Circuits that detect the operating voltage and supply the defined level are also referred to as power-on-reset, or POR, circuits. For example, when a defined level of the supply voltage is reached, at which the digital elements of the semiconductor circuit can begin to function safely, an output signal of the POR circuit is designed to change its digital level. In many cases, the defined level is emitted in inverted form. The corresponding signals are often referred to as reset and inverted reset signals, respectively.

There already exist various POR circuits, each concentrating on given parameters such as a precise switching threshold, a low power consumption, temperature stability or temporally defined duration of the output signal. In many designs, a bandgap structure is used to achieve a precise switching threshold. To achieve low power consumption, high resistances that can limit the current flow are used in conventional POR circuits. Alternatively, conventional POR circuits have an energy-saving mode that can be actuated from the outside or by self-shutoff. Such POR circuits generally have a large space requirement and/or a still considerable power need when integrated on a semiconductor.

SUMMARY OF THE INVENTION

One object of the invention is to provide a circuit arrangement for operating voltage detection that is distinguished by a temperature-independent switching threshold with a reduced cost.

In one embodiment, a circuit arrangement for operating voltage detection comprises a first and a second supply voltage terminal, a detection block and a control block. The detection block comprises a first transistor, which is connected between the first supply voltage terminal and a first node and has a first control terminal, and a first resistor element, which is connected between the first node and the second supply voltage terminal. In the detection block, a second transistor is also provided, which is connected between the first supply voltage terminal and a second node and has a second control terminal, as well as a second resistor element, which is connected between the second node and the second supply voltage terminal. A first switch connects the first node to the second node. A third resistor element is connected between the second control terminal and the first supply voltage terminal. The control block is set up to derive a first switching signal as a function of a voltage at the second node, as well as a second switching signal by inverting the first switching signal. The first switching signal is supplied in this case to the first switch, and the second switching signal to the first control terminal.

In the detection block, the first transistor and the first resistor element form a series circuit that forms a current path between the first and second supply voltage terminals. The first node, as a connecting node between the first transistor and the first resistor element, is coupled via the first switch to the control terminal of the second transistor. The latter in turn forms an additional series circuit between the first and second supply voltage terminals. The second node, as a connecting node between the second transistor and the second resistor element, serves as the output of the detection block.

In the operation of the circuit arrangement, the transmission behavior of the first transistor and the first switch is determined by the first and second switching signals. The first transistor and the first switch, or the first and second switching signals, are configured in the initial state of the circuit arrangement in such a manner that the first switch is conductive, while the first transistor has a resistance value that decreases with increasing operating voltage. At a low operating voltage, for example, the resistance value of the first transistor is distinctly higher than that of the first resistor element, so that a potential arises at the first node that tends toward the reference potential at the second supply voltage terminal.

The voltage at the first node is fed via the first switch to the control terminal of the second transistor. This voltage in turn determines the resistance value of the second transistor. A voltage corresponding to the resistance ratio between the second transistor and the second resistor element arises at the second node and thus at the output of the detection block. For low operating voltages, the voltage at the second node tends in the direction of the operating voltage, while for increasing and larger voltages, the voltage at the second node tends toward the reference potential. The voltage at which the second node changes tendency is defined as the changeover voltage.

The voltage at the second node is evaluated in the downstream control block and optionally amplified to generate a logically defined switching signal. The switching signal can thus be understood as a signal that either has a level corresponding to the voltage at the second supply voltage terminal or a level corresponding to the voltage at the first supply voltage terminal. In other terms, a defined voltage level is derived in the control block from the voltage level at the second node, which is slowly moving from the operating voltage to the reference voltage at the time of the changeover. The defined voltage level is used for generating the first control signal. In addition, the second switching signal is derived in the control block from the first switching signal, for example, by means of a conventional inverter circuit. The first and/or the second switching signal can be used as an output signal of the circuit arrangement to characterize a state of the operating voltage detection.

The first switch, for example, comprises a third transistor. The first and second transistors are preferably constructed as p-channel field effect transistors, and the first switch or third transistor as an n-channel field effect transistor. In this case it can prove favorable if the first and second transistors have a forward voltage matched to one another. To put it another way, the first and second transistors in this case have a respective forward voltage at an equal temperature, the ratio of which voltages determines the switching threshold of the circuit arrangement. Thus, the effects of temperature fluctuations between the first and the second transistors largely compensate for one another, whereby the circuit arrangement becomes more temperature-stable or temperature-independent.

Alternatively, the first and second transistors are constructed as n-channel field effect transistors, and the first switch or third transistor as a p-channel field effect transistor. Potentials at the first and second supply voltage terminal and logic states of the respective switching signals must be appropriately adjusted.

In different embodiments, the first resistor element is implemented as a polysilicon resistor, preferably a voltage-independent polysilicon resistor, particularly in an integrated construction of the circuit arrangement. The second and third resistor elements can likewise be implemented as polysilicon resistors. Alternatively the second and third resistor elements comprise a controlled transistor. In this case, the transistors are operated as resistors.

In one embodiment, the control block comprises a series circuit of a first, a second and a third inverter, wherein the first switching signal can be tapped at the output of the second inverter and the second switching signal at the output of the third inverter. In particular, the second inverter is directly downstream of the first inverter, and the third inverter is directly downstream of the second inverter.

In a special embodiment, the first inverter has an asymmetrical switching threshold. Additionally or alternatively, the second inverter may also have an asymmetrical switching threshold. By virtue of the asymmetrical switching threshold, one can achieve the effect that the corresponding inverter has a preferential direction with respect to the output level. For example, the first inverter is dimensioned in such a manner that its output level tends toward the reference potential in case of an ambiguous input signal. Thus it can be guaranteed in the switch-on process of the circuit arrangement that the first and second switching signals have a defined level. In the previously described case, the second inverter is preferably dimensioned in such a manner that the output signal tends towards the operating voltage in case of an ambiguous input signal, which supports the generation of defined levels in the switch-on process. At the latest at the output of the second inverter, a defined level with high precision that determines the first switching signal can be achieved by means of an asymmetrical switching threshold. Accordingly, the second switching signal at the output of the third inverter is also reliably determined.

In one embodiment, the control block comprises a second switch that couples a connecting node of the first and second inverters via, for example, a resistor to the second supply voltage terminal. In this case, a control terminal of the second switch is led out of the circuit and can therefore be controlled externally. For instance, the second switch may be implemented as a field-effect transistor, wherein the forward resistance simultaneously forms the above-mentioned resistor.

If the necessary operating voltage threshold, defined by the switching thresholds of the first and second transistors, has been reached in the present circuit arrangement, then not only is a corresponding logic signal emitted by the circuit arrangement; the detection block is substantially de-energized by the first and second switching signals, so that power consumption by the detection block is nearly completely prevented.

If, however, the operating voltage decreases back below the desired level during operation, it would be desirable in some cases if this changed operating state could again be detected and correspondingly signaled on the output side. It would likewise be desirable in this case if there could be corresponding signaling by the circuit arrangement when the operating voltage exceeds the appropriate level. The optional second switch has the effect that the input of the second inverter is drawn or can be drawn in the direction of reference potential for a corresponding operating voltage. In case of a sufficient operating voltage, the effects in the first inverter predominate, so that a level essentially in the range of the operating voltage results between the first and the second inverters. If the operating voltage is too low, however, the influence of the connected resistor predominates, so that the first and second switching signals are reset corresponding to the power-on state. Since the connected resistor causes a flow of current, it can be favorable to prevent this current flow by means of the second switch. The switch limiting the current flow is preferably controlled by a circuit downstream of the circuit arrangement that automatically closes the switch if the operating voltage is too low.

Thus a high detection precision of the operating voltage and a low power consumption of the circuit arrangement are achieved by means of the second switch.

In another embodiment, the circuit arrangement further comprises a buffer block that comprises a series circuit of a fourth and a fifth inverter downstream of an output of the control block. By virtue of the fourth and fifth inverters the switching flanks of the corresponding signals can become steeper in order to avoid switching losses in downstream circuits, in which lower power consumption is effected. The defined signal for operating voltage detection as well as the corresponding inverted signal can be applied at the output of the fourth and fifth inverter, respectively. Accordingly, additional inverters can also be connected downstream for signal stabilization and improvement of switching flanks.

BRIEF DESCRIPTION OF THE DRAWINGS

Embodiments of the invention will be described in detail below with reference to the figures. Elements with identical function or effect bear identical reference numbers. A corresponding explanation of such elements will therefore not necessarily be repeated.

DETAILED DESCRIPTION OF THE DRAWINGS

Figure 1:
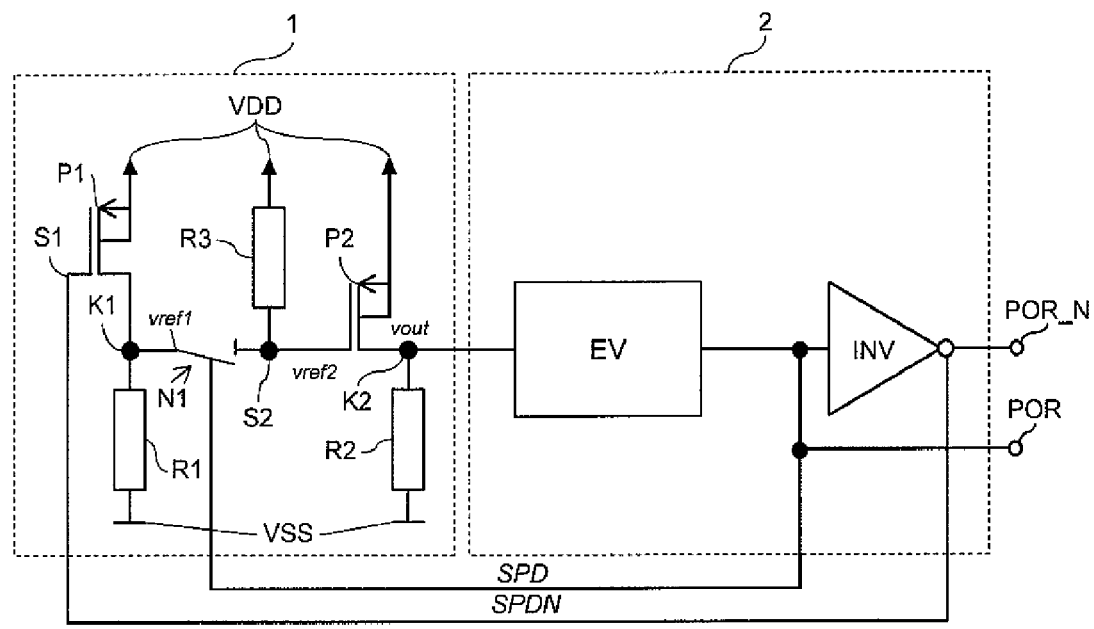
FIG. 1 shows a first example of an embodiment of a circuit arrangement for operating voltage detection.

FIG. 1 shows an example of an embodiment of a circuit arrangement for operating voltage detection with detection block 1 and control block 2. Detection block 1 comprises a first series circuit of a first transistor P1 with a first resistor element R1 connected between a first supply voltage terminal VDD and a second supply voltage terminal VSS. In addition, a second series circuit of a second transistor P2 and a second resistor element R2 is connected between first supply voltage terminal VDD and second supply voltage terminal VSS. First transistor P1 has a first control terminal S1. A second control terminal S2 of second transistor P2 is connected via a first switch N1 to a first connection node K1 between first transistor P1 and first resistor element R1. Second control terminal S2 is further connected via a third resistor element R3 to first supply voltage terminal VDD. A second connecting node K2 between second transistor P2 and second resistor element R2 forms an output of detection block 1 that is coupled to control block 2.

Control block 2 comprises an evaluation circuit EV, which is connected on the input side to second node K2, and on the output side, to an inverter INV. A signal output POR is connected to the output of evaluation circuit EV. A signal output POR_N is connected to the output of inverter INV. The output of evaluation circuit EV is further connected to first switch N1 in order to control it. First control terminal S1 of first transistor P1 is connected to the output of inverter INV.

In the operation of the circuit arrangement, an operating voltage VDD to be detected is present at the first supply voltage terminal. Accordingly, a reference voltage, which can be formed, for example, by a ground potential, is present at second supply voltage terminal VSS. First and second transistors P1, P2 in this case are represented as p-channel field-effect transistors. A voltage vref1 at first connection node K1 is determined during operation of the arrangement essentially by the resistance ratio between a supply voltage-dependent resistance value of first transistor P1 and the supply voltage-independent resistance value of first resistor element R1. At second node K2, which forms the output of detection block 1, a voltage vout is determined from an inverting circuit element of second transistor P2 and second resistor element R2. When the operating voltage increases, first transistor P1, which is operated initially essentially in the resistance range, begins to conduct. Transistor P1 is dimensioned such that up to a defined threshold, its resistance value is markedly higher than that of first resistor element R1. A first switching signal SPD that serves to actuate first switch N1 has a level that substantially corresponds to the operating voltage. Accordingly, a second, inverted signal SPDN for controlling first transistor P1 has a level that corresponds to the operating voltage.

With a rising operating voltage, the voltage vref1 increases, as does the voltage vref2 as well with switch N1 closed; the increase of the voltages vref1, vref2 first becomes noticeable after the turn-on voltage of first transistor P1 has been reached. In addition, voltages vref1, vref2 initially increase more slowly than the operating voltage. Transistor P2 is activated by voltage vref2, so that essentially the operating voltage results as the voltage vout at node K2. Above a defined supply voltage, vref begins to increase more rapidly than the supply voltage. If vref reaches a value at which it decreases below the turn-on voltage of second transistor P2, then vout rapidly changes from the operating voltage to the reference voltage. Evaluation circuit EV ensures that the level of first switching signal SPD is subsequently changed from the operating voltage to the reference voltage. Accordingly, the second switching signal SPDN at the input of inverter INV has a resulting level that substantially corresponds to the operating voltage.

Thereby, first switch N1 is first shifted into an open, nonconductive state and then first transistor P1 is shifted into a blocked state. Second control terminal S2 is drawn to operating voltage potential via third resistor element R3, whereby second transistor P2 is likewise switched to a nonconductive, de-energized state. Via resistor element R2, voltage vout thus lies essentially at the potential of the reference voltage.

The corresponding switching signals at signal outputs POR, POR_N can be evaluated by downstream circuit components, and indicate the reaching of a defined operating voltage. Since transistors P1, P2 or switch N1 in detection block 1 are in an open state in this case, and thus de-energized, no loss power due to current flows is generated in detection block 1 after the defined threshold value of the operating voltage has been reached. To put it in other terms, detection block 1 can be operated with a lower energy expense.

In the arrangement illustrated in FIG. 1, the elements can also be replaced by corresponding complementary elements. For example, n-channel field-effect transistors are replaced by p-channel field-effect transistors, with the potentials at the first and second supply voltage terminals being simultaneously interchanged. The logic of the switching signals likewise changes complementarily, or is inverted. For the sake of clarity, such a modified circuit will not be presented and described in detail here.

Figure 2:
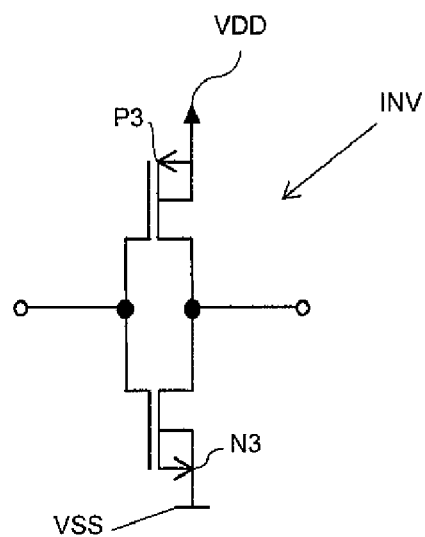
FIG. 2 shows an example of an inverter.

FIG. 2 shows a possible construction of inverter INV in control block 2 of FIG. 1. Inverter INV comprises a series connection of a p-channel field-effect transistor P3 and an n-channel field-effect transistor N3 connected between first supply voltage terminal VDD and second supply voltage terminal VSS. The control terminals or gates of transistors P3, N3 together form an input of inverter INV. A connection node of the controlled paths of transistors P3, N3 forms the output of inverter INV.

Figure 3:
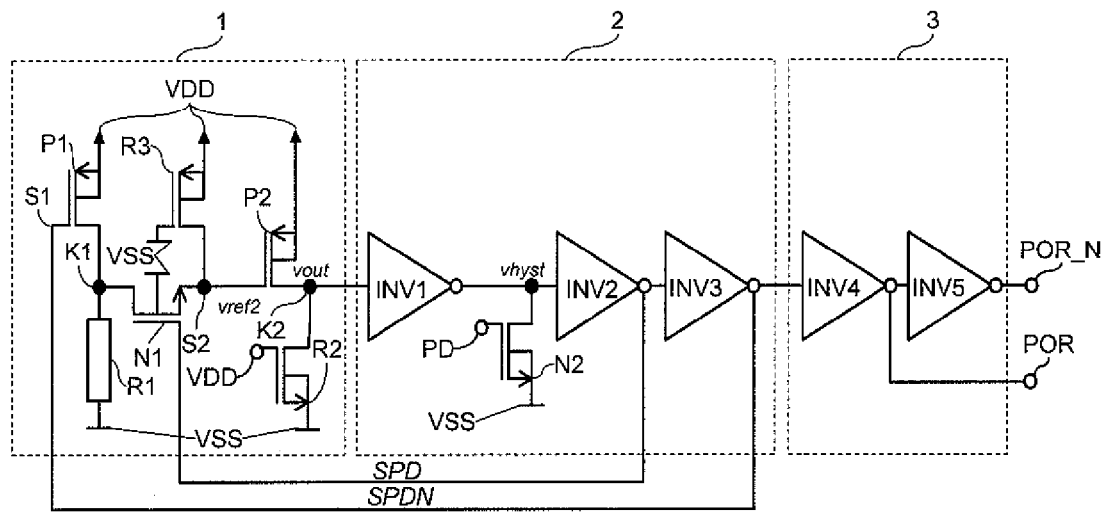
FIG. 3 shows a second example of an embodiment of a circuit arrangement for operating voltage detection.

FIG. 3 shows an additional example of a circuit arrangement for operating voltage detection, which is similar to or corresponds to the embodiment example in FIG. 1. While first resistor element R1 in FIGS. 1 and 3 is preferably implemented as polysilicon resistor, third resistor element R3 is implemented as a controlled transistor. In particular, third resistor element R3 in this embodiment example is implemented s a p-channel field-effect transistor, the gate terminal or control terminal of which is coupled to second supply voltage terminal VSS. Second resistor element R2 can preferably be implemented as a controlled transistor, but also as a polysilicon resistor. First switch N1 in this embodiment example is implemented as an n-channel field-effect transistor.

Control block 2 has a series connection of a first inverter INV1, a second inverter INV2 and a third inverter INV3. The input of first inverter INV1 is connected to second node K2. Second inverter INV2, which is connected on the input side to the output of first inverter INV1, supplies first switching signal SPD at its output. Inverter INV3, connected downstream of inverter INV3, supplies the second, inverted, switching signal SPDN at its output. In this embodiment example, a buffer block 3, which comprises a series circuit of a fourth and fifth inverter INV4, INV5 that is connected to the output of third inverter INV3, is downstream of control block 2. Signal output POR is connected to the output of fourth inverter INV4, while signal output POR_N is coupled to the output of fifth inverter INV5.

With respect to FIG. 1, the evaluation circuit EV can include inverters INV1, INV2, and second switch N2 in various embodiments.

A connection node of first and second inverters INV1, INV2 is coupled via a second switch N2 implemented as an n-channel field-effect transistor to the second supply voltage terminal. A control terminal or gate terminal of second switch N2 is connected to a terminal PD.

Inverters INV1-INV5 are implemented, for example, corresponding to the inverter illustrated in FIG. 2. First inverter INV1 has an asymmetrical switching threshold, so that the signal at the output of first inverter INV1 preferably tends in the direction of the reference voltage. This can be achieved, for example, by constructing the corresponding n-channel field-effect transistor stronger than the associated p-channel field-effect transistor. In the preferential direction of first inverter INV1, the resulting first switching signal SPD at the output of second inverter INV2 has a strong tendency towards the operating voltage. This can be supported by an additional asymmetrical switching threshold for the second inverter INV2. This can be accomplished, for example, by a stronger construction of the p-channel field-effect transistor in comparison to the n-channel field-effect transistor. By means of the asymmetries of inverters INV1, INV2, defined states can be achieved in the turn-on process of the circuit arrangement. The remaining inverters INV3, INV4, INV5 are preferably implemented with a symmetrical switching threshold. A preferential direction is not necessary, because of the already defined output signals of first and second inverters INV1, INV2.

The switching processes in detection block 1 and control block 2 when the operating voltage is applied and increased correspond substantially to the embodiments described for FIG. 1. If transistors P1, P2, N1 in detection block 1 are shut off when the defined voltage threshold of the operating voltage is reached, this can have the effect that when the operating voltage is reduced below the defined voltage threshold, the output signals to signal outputs POR, POR_N, or the switching signals SPD, SPDN are no longer actively reset to the initial state. At high temperatures, a reset can take place as a result of leakage currents occurring through the preferential directions of INV1 and INV2.

In order to guarantee resetting even at lower temperatures, the input of second inverter INV2, at which a voltage vhyst is present, can be drawn via second switch N2 in the direction of the reference potential. The supply voltage is applied in this case to PD. Switch N2, implemented in this case as a transistor, acts as a high-impedance resistor. Transistor N2 is preferably active if first inverter INV1 can only supply an insufficiently defined switching signal. If the reference potential Is present at the input of second inverter INV2, first switching signal SPD is again brought to a level in the range of the operating voltage, as in the original power-on process. Second switching signal SPDN is correspondingly brought to a level in the range of the reference potential. The resistance of transistor N2 should be active in the range of the defined detection voltage and consequently requires an additional current. In order to avoid losses from this current, a control signal at terminal PD can be drawn to the reference potential, in order to cut off resistor N2 completely.

Figure 4:
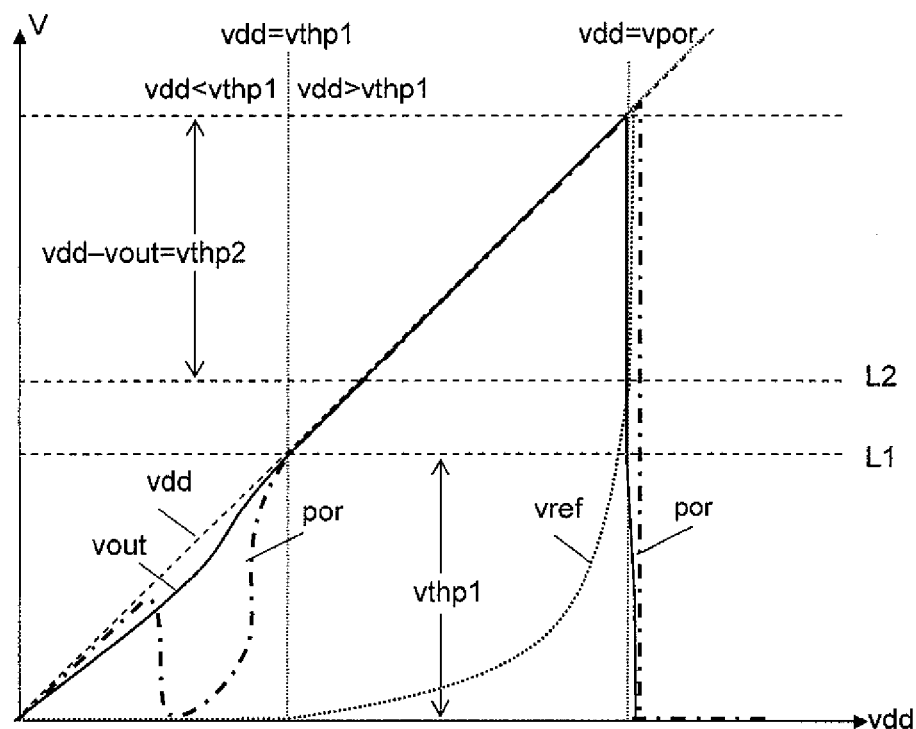
FIG. 4 shows a voltage diagram of signals in an example of a circuit arrangement for operating voltage detection.

FIG. 4 shows a voltage diagram with various voltages that can occur in the circuit arrangement according to FIG. 1 or FIG. 3, as a function in each case of the applied operating voltage VDD. The processes in the circuit arrangement are to be explained based on the voltages in the different voltage ranges, with reference to the embodiment examples of the circuit arrangement.

In FIG. 4, vdd represents the operating voltage, vthp1 and vthp2 represent the forward voltages or threshold voltages of first and second transistors P1, P2, respectively, vpor represents the defined detection voltage and por represents the output signal at signal output POR.

In the voltage range in which the operating voltage vdd has not yet reached the forward voltage with of transistors P1, P2, vdd<vthp1, leakage currents of the circuit elements define at least part of the switching behavior of the circuit arrangement. For example, such leakage currents appear at the transistors of inverters INV1, INV2. As explained above with respect to the embodiment examples of FIGS. 1 and 3, with an appropriate dimensioning of the circuit elements, voltage vout tends to vdd, first switching signal SPD likewise to vdd, and second switching signal SPDN tends to reference potential at the second supply voltage terminal VSS. The output signal por tends substantially to vdd in this range. A drop of the signal por in the direction of reference potential is too small to be evaluated in the downstream circuit.

If the operating voltage exceeds the required forward voltage vthp1 of first transistor P1, vdd>vthp1, then it begins to conduct. If the gate voltage at first control terminal S1 of first transistor P1 lies at reference potential, the voltage vref1 at first node K1 is led via the closed first switch N1 to second control terminal S2 of transistor P2 and appears there as a voltage vref2. Since first transistor P1 is much higher-impedance in the range than first resistor element R1, vref1 or vref2 are nearly at reference potential when forward voltage vthp1 is reached. The voltages vref1 and vref2 are shown simplified in FIG. 4 as a voltage vref. Second transistor P2 actively switches the voltage vout to vdd when forward voltage vthp1 is reached. Consequently, switching signals SPD and SPDN are likewise actively amplified and strengthen the feedback. A further increase of operating voltage vdd assures that the resistance A of first transistor P1 becomes increasingly low-ohmic. Thereby vref increases faster than vdd.

If the level of vref reaches such a high voltage that the forward voltage vthp2 is not reached, vdd−vref=vthp2 or vdd=vpor, then the voltage vout flips from vdd to reference potential. To put it in other terms, the defined operating voltage vpor is reached at this point in time or with this voltage constellation. By suitable dimensioning of the downstream inverters INV1, INV2, INV3, it can be guaranteed that not all inverters flip to operating voltage vdd at this level. For example, the dimensioning can be such that the operating voltage vdd must be slightly increased for the fedback first switching signal SPD to likewise flip from vdd to reference potential. Consequently, first switch N1 is turned off by first switching signal SPD. Therefore, third resistor element R3 pulls the level vref2 at second control terminal S2 all the way to vdd, whereby second transistor P2 is shut off. Since the circuit is now in a stable state, transistor P1 can likewise by turned off via the signal SPDN. Thus the entire detection block is disconnected.

At this time, or under these voltage conditions, the output signals at signal outputs POR and POR_N likewise switch from vdd to reference potential or from reference potential to VDD.

In summary, the circuit arrangement for operating voltage detection in the above-described embodiments offers several properties. For instance, if p-channel field-effect transistors are used for first and second transistors P1, P2, and with a suitable dimensioning of resistor element R1, a switching threshold for the defined operating voltage vpor can be set in a low range. For example the defined operating voltage vpor can varies in a range of 1.0 V to 1.4 V.

Moreover, one obtains a temperature behavior adapted to the voltage vout by means of the comparison of the forward voltages of transistors P1 and P2. This can be achieved particularly if first and second transistors P1, P2 are of the same transistor type. Only an absolute fluctuation of the forward voltages and fluctuations of the resistance value of resistor element R1 have an influence on the voltage vout. Thus the switching threshold for the defined operating voltage vpor is subject to only small fluctuations even in case of severe process variations.

The position of the thresholds L1, L2 shown in FIG. 4 is defined by the respective forward voltages vthp1, vthp2 of transistors P1, P2. A temperature independence of the circuit arrangement with adjusted forward voltages vthp1, vthp2 is also shown in the fact that, in case of a change in forward voltages due to varied temperature, the position of thresholds L1, L2 is changed uniformly or symmetrically. For example, threshold L1 increases with increasing forward voltage vth, while threshold L2 decreases by the same magnitude. This applies accordingly to decreasing voltages.

The circuit arrangement is distinguished by low power consumption. In the dimensioning of resistor element R1, a high resistance, in the megaohm range, for example, is fundamentally desirable in order to keep power consumption as low as possible. Thereby, however, the surface area increases in case of integration on a semiconductor chip on the one hand, and on the other, the high resistance can lead to a larger fluctuation of the switching threshold for a defined operating voltage. Accordingly, the resistance of first resistor element R1 can be chosen to be smaller, for example, in the range of several tens of kiloohms. A current of several microamperes, for example, will be cut off when the threshold is reached.

A danger that the circuit arrangement could begin to oscillate due to the feedback can be reduced by appropriate dimensioning of the elements. In particular, the above-described asymmetrical switching threshold of the inverters can have a supportive effect in this regard.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

I claim:

1. A circuit arrangement for operating voltage detection, comprising:
   a first and a second supply voltage terminal;
   a detection block with a first transistor that is connected between the first supply voltage terminal and a first node and has a first control terminal, with a first resistor element that is connected between the first node and the second supply voltage terminal, with a second transistor that is connected between the first supply voltage terminal and a second node and has a second control terminal, with a second resistor element that is connected between the second node and the second supply voltage terminal, with a first switch that connects the first node to the second control terminal, and with a third resistor element that is connected between the second control terminal and the first supply voltage terminal; and
   a control block that is set up to derive a first switching signal as a function of a voltage at the second node, as well as a second switching signal by inverting the first switching signal, and to supply the first switching signal to the first switch and the second switching signal to the first control terminal.

2. The circuit arrangement according to claim 1, wherein the first switch comprises a third transistor.

3. The circuit arrangement according to claim 2, wherein first and second transistors are p-channel field effect transistors, and the third transistor is an n-channel field effect transistor.

4. The circuit arrangement according to claim 2, wherein first and second transistors are n-channel field effect transistors, and the third transistor is a p-channel field effect transistor.

5. The circuit arrangement according to claim 3, wherein first and second transistors have a temperature behavior adapted to their forward voltages.

6. The circuit arrangement according to claim 1, wherein the first resistor element is a polysilicon resistor.

7. The circuit arrangement according to claim 1, wherein second and third resistor elements comprise a controlled transistor.

8. The circuit arrangement according to claim 1, wherein the control block comprises a series circuit of a first, a second and a third inverter, wherein the first switching signal is provided at the output of the second inverter and the second switching signal at the output of the third inverter.

9. The circuit arrangement according to claim 8, wherein the first and/or second inverter have an asymmetrical switching threshold.

10. The circuit arrangement according to claim 8, wherein the control block comprises a second switch that couples a connecting node of first and second inverters to the second supply voltage terminal.

11. The circuit arrangement according to claim 10, wherein the second switch is a field-effect transistor.

12. The circuit arrangement according to claim 1, further comprising a buffer block that comprises a series circuit of a fourth and a fifth inverter downstream of an output of control block.

* * * * *

UNITED STATES PATENT AND TRADEMARK OFFICE
CERTIFICATE OF CORRECTION

PATENT NO. : 8,188,775 B2  
APPLICATION NO. : 12/750040  
DATED : May 29, 2012  
INVENTOR(S) : Johannes Fellner Page 1 of 1

It is certified that error appears in the above-identified patent and that said Letters Patent is hereby corrected as shown below:

Title Page should read

--(73) austriamicrosystems AG  
Unterpremstätten ~~(AU)~~ <u>AT</u>--

Signed and Sealed this  
Ninth Day of April, 2013

Teresa Stanek Rea  
*Acting Director of the United States Patent and Trademark Office*